US010123470B2

(12) United States Patent
Itoh et al.

(10) Patent No.: US 10,123,470 B2
(45) Date of Patent: Nov. 6, 2018

(54) ELECTRONIC COMPONENT MOUNTING SYSTEM AND ELECTRONIC COMPONENT MOUNTING METHOD

(71) Applicant: Panasonic Intellectual Property Management Co., Ltd., Osaka (JP)

(72) Inventors: Katsuhiko Itoh, Yamanashi (JP); Nobuo Komiya, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 200 days.

(21) Appl. No.: 14/655,560

(22) PCT Filed: Dec. 19, 2013

(86) PCT No.: PCT/JP2013/007476
§ 371 (c)(1),
(2) Date: Jun. 25, 2015

(87) PCT Pub. No.: WO2014/103261
PCT Pub. Date: Jul. 3, 2014

(65) Prior Publication Data

US 2015/0359149 A1 Dec. 10, 2015

(30) Foreign Application Priority Data

Dec. 25, 2012 (JP) ................................ 2012-280663

(51) Int. Cl.
*H05K 3/30* (2006.01)
*H05K 13/08* (2006.01)
(Continued)

(52) U.S. Cl.
CPC ............ *H05K 13/08* (2013.01); *H05K 3/341* (2013.01); *H05K 13/0465* (2013.01); *Y10T 29/49135* (2015.01); *Y10T 29/53013* (2015.01)

(58) Field of Classification Search
CPC ....... B23K 1/203; H01L 24/742; H01L 24/75; H01L 24/81; H05K 3/0097; H05K 3/303;
(Continued)

(56) References Cited

U.S. PATENT DOCUMENTS 5,588,195 A * 12/1996 Asai .................. H05K 13/0413 29/33 M
6,789,720 B2 * 9/2004 Uchida ............... B23K 3/0669 228/102
(Continued)

FOREIGN PATENT DOCUMENTS

CN 102164473 A 8/2011
EP 1239719 A2 11/2002
(Continued)

OTHER PUBLICATIONS

International Search Report for Application No. PCT/JP2013/007476 dated Apr. 1, 2014.

*Primary Examiner* — Paul D Kim
(74) *Attorney, Agent, or Firm* — Pearne & Gordon LLP

(57) ABSTRACT

An electronic component mounting system includes: a printing apparatus; a plurality of electronic component mounting apparatuses; and a mounting information storage unit which stores mounting information. The mounting information includes execution mode information in which one of a first mounting mode and a second mounting mode is set for each of electronic component mounting apparatuses. In the first mounting mode, the electronic component is placed at a mounting position corrected on the basis of a recognition result of a first recognition mark formed on a board. In the second mounting mode, the electronic component is placed at a mounting position corrected on the basis of a recognition result of a second recognition mark formed by paste printed on the board. The electronic components are mounted on the
(Continued)

board according to mounting modes set for each of the electronic component mounting apparatuses by referring to the mounting information.

9 Claims, 13 Drawing Sheets

(51) Int. Cl.
*H05K 3/34* (2006.01)
*H05K 13/04* (2006.01)

(58) Field of Classification Search
CPC .... H05K 3/341; H05K 3/3468; H05K 3/3473; H05K 3/3494; H05K 13/08; H05K 13/0465; Y10T 29/49128; Y10T 29/4913; Y10T 29/49149; Y10T 29/49144; Y10T 29/49155; Y10T 29/49163; Y10T 29/49169; Y10T 29/49213; Y10T 29/49224; Y10T 29/49904; Y10T 29/5196; Y10T 29/53048; Y10T 29/53091; Y10T 29/5313; Y10T 29/53187
See application file for complete search history.

(56) References Cited

U.S. PATENT DOCUMENTS

| | | | | |
|---|---|---|---|---|
| 6,971,161 | B1 * | 12/2005 | Maenishi ............... | H05K 13/04 29/739 |
| 7,047,632 | B2 * | 5/2006 | Arikado ............ | H01L 21/67144 29/825 |
| 7,841,079 | B2 * | 11/2010 | Inoue ..................... | H05K 3/303 29/739 |
| 8,240,543 | B2 * | 8/2012 | Nishi ................... | H05K 3/3436 228/103 |
| 2002/0157488 | A1 | 10/2002 | Nagafuku et al. | |
| 2003/0177633 | A1 * | 9/2003 | Haji .................. | H01L 21/67144 29/743 |
| 2005/0077340 | A1 | 4/2005 | Nagafuku et al. | |
| 2008/0014772 | A1 | 1/2008 | Ogura et al. | |
| 2009/0224026 | A1 * | 9/2009 | Yamamoto .......... | H01L 21/6835 228/179.1 |
| 2009/0293265 | A1 | 12/2009 | Inoue et al. | |
| 2010/0222226 | A1 * | 9/2010 | Ishihara ................. | C12Q 1/003 506/9 |
| 2015/0351295 | A1 * | 12/2015 | Itoh ........................ | H05K 13/08 228/102 |

FOREIGN PATENT DOCUMENTS

| | | | |
|---|---|---|---|
| JP | 2003-229699 | A | 8/2003 |
| JP | 2007-220837 | A | 8/2007 |
| JP | 3983274 | B2 | 9/2007 |
| JP | 2008-270696 | A | 11/2008 |
| JP | 2011-029254 | A | 2/2011 |
| JP | 4996634 | B2 | 8/2012 |

* cited by examiner

40a MOUNTING APPARATUS M2 40b 40c

| No | COMPONENT INFORMATION | MOUNTING COORDINATES | | |
|---|---|---|---|---|
| | | X | Y | θ |
| 1 | A | X1 | Y1 | θ 1 |
| 2 | A | X2 | Y2 | θ 2 |
| 3 | A | X3 | Y3 | θ 3 |
| 4 | A | X4 | Y4 | θ 4 |
| ⋮ | ⋮ | ⋮ | ⋮ | ⋮ |

40a MOUNTING APPARATUS M3 40b 40c

| No | COMPONENT INFORMATION | MOUNTING COORDINATES | | |
|---|---|---|---|---|
| | | X | Y | θ |
| 1 | B | X1 | Y1 | θ 1 |
| 2 | B | X2 | Y2 | θ 2 |
| 3 | B | X3 | Y3 | θ 3 |
| 4 | C | X4 | Y4 | θ 4 |
| ⋮ | ⋮ | ⋮ | ⋮ | ⋮ |

40a MOUNTING APPARATUS M4 40b 40c

| No | COMPONENT INFORMATION | MOUNTING COORDINATES | | |
|---|---|---|---|---|
| | | X | Y | θ |
| 1 | C | X1 | Y1 | θ 1 |
| 2 | D | X2 | Y2 | θ 2 |
| 3 | D | X3 | Y3 | θ 3 |
| 4 | D | X4 | Y4 | θ 4 |
| ⋮ | ⋮ | ⋮ | ⋮ | ⋮ |

| No | COMPONENT INFORMATION | SIZE | | | MOUNTING MODE |
|---|---|---|---|---|---|
| | | X | Y | Z | |
| 1 | A | XA | YA | ZA | 2 |
| 2 | B | XB | YB | ZB | 2 |
| 3 | C | XC | YC | ZC | 1 |
| 4 | D | XD | YD | ZD | 1 |
| ⋮ | ⋮ | ⋮ | ⋮ | ⋮ | ⋮ |

| No | MOUNTING MODE | MOUNTING MODE EFFECTIVENESS | | | FOLLOW RATIOS R (%) | | | LIMIT VALUES (mm) | | |
|---|---|---|---|---|---|---|---|---|---|---|
| | | X | Y | $\theta$ | X | Y | $\theta$ | X | Y | $\theta$ |
| 1 | 2 | ○ | ○ | ○ | 70 | 70 | 70 | dXA | dYA | d$\theta$A |
| 2 | 2 | ○ | ○ | × | 50 | 50 | — | dXB | dYB | — |
| 3 | 1 | — | — | — | — | — | — | — | — | — |
| 4 | 1 | — | — | — | — | — | — | — | — | — |
| ⋮ | ⋮ | ⋮ | ⋮ | ⋮ | ⋮ | ⋮ | ⋮ | ⋮ | ⋮ | ⋮ |

40(4)

40i 40j

| APPARATUS NO. | MOUNTING MODULE TO BE APPLIED |
|---|---|
| MOUNTING APPARATUS M3 | 2 |
| MOUNTING APPARATUS M4 | 2 |
| MOUNTING APPARATUS M5 | 1 |

ELECTRONIC COMPONENT MOUNTING SYSTEM AND ELECTRONIC COMPONENT MOUNTING METHOD

TECHNICAL FIELD

The present invention relates to an electronic component mounting system and an electronic component mounting method for mounting an electronic component on a board.

BACKGROUND ART

An electronic component mounting systems which manufactures a mounted board by mounting an electronic component on a board by soldering is formed by connecting a plurality of apparatuses for electronic component mounting such as a solder printing apparatus, an electronic component placing apparatus, and a reflow apparatus. In the electronic component mounting system, a position correcting technique in which solder position information acquired by measuring solder printing positions actually is fed forward to a post-process is known as a technique for preventing a mounting failure due to deviations of solder printing positions relative to the positions of soldering electrodes formed on a board (refer to Patent Document 1, for example).

In the example described in Patent Document 1, printing position deviations are detected by disposing a print inspection apparatus between a printing apparatus and an electronic component placing apparatus, and mounting position correction information for minimizing influences of the printing position deviations is transmitted to the downstream electronic component placing apparatus. With this measure, the influences of the printing position deviations can be reduced utilizing what is called a self-alignment effect that electrodes attract an electronic component due to the surface tension of molten solder in a reflow process that is executed after placement of the component. As a result, high mounting quality of a mounted board manufacturing process can be secured.

RELATED ART DOCUMENTS

Patent Documents

Patent Document 1: JP-A-2003-229699

SUMMARY OF THE INVENTION

Problem to be Solved by the Invention

Incidentally, the above-mentioned self-alignment effect does not act on every kind of electronic component uniformly but varies in the strength of action depending on the electrode shape, the size and mass of a component, the characteristics of solder used, and other factors. For example, the effect is insufficient for large-mass electronic components because they are not moved by attractive force of surface tension. Furthermore, where the planar shape or arrangement of electronic component may not be symmetrical, it is difficult to obtain an intended alignment effect because an asymmetrical attractive force acts on an electronic component so as to rotate it while solder is melted.

However, in the related art including the example of the above-mentioned patent document, the placement position correction that uses solder printing positions as references is applied uniformly irrespective of the kinds of electrodes and electronic components, and is applied uniformly irrespective of the kinds of electronic component mounting apparatuses in a system including a plurality of electronic component mounting apparatuses. As a result, the position correction may cause, contrary to the intention, a bonding failure in a soldering process for a certain kind of electronic component in the same board. As exemplified above, the related art electronic component mounting is associated with a problem that the method for applying the mounting position correction using solder printing positions as references is not always proper and there may occur a case that an intended bonding quality enhancement effect cannot be obtained.

An object of the present invention is to provide an electronic component mounting system and an electronic component mounting method that can obtain an intended bonding quality enhancement effect by properly applying a mounting position correction using solder printing positions as references.

Means for Solving the Problem

The present invention provides an electronic component mounting system which is formed by connecting a plurality of electronic component mounting apparatuses and which manufactures a mounted board by mounting electronic components on a board, the electronic component mounting system including: a printing apparatus which prints solder on a component bonding electrode formed on the board on which a first recognition mark is formed in advance and which prints solder as a second recognition mark on the board at a prescribed position; a plurality of electronic component mounting apparatuses, each of which positions the solder-printed board, picks up an electronic component from a components supply unit by a mounting head, and transfers and places the electronic component to and on the solder-printed board; and a mounting information storage unit which stores mounting information that indicates execution modes of mounting operations to be performed by the electronic component mounting apparatus, wherein the mounting information includes execution mode information in which one of two mounting modes comprising a first mounting mode and a second mounting mode is set for each of the electronic component mounting apparatuses in advance, wherein in the first mounting mode, the electronic component is transferred to and placed at a mounting position that has been corrected on the basis of a recognition result of the first recognition mark, and wherein in the second mounting mode, the electronic component is transferred to and placed at a mounting position that has been corrected on the basis of a recognition result of the second recognition mark; and wherein the electronic component mounting apparatuses mount electronic components on the board according to mounting modes that are set for the respective electronic component mounting apparatuses in advance by referring to the mounting information.

The present invention provides an electronic component mounting method for manufacturing a mounted board by mounting electronic components on a board by an electronic component mounting system formed by connecting a plurality of electronic component mounting apparatuses, the electronic component mounting method including: a printing step of printing solder on a component bonding electrode formed on the board on which a first recognition mark is formed in advance, and printing solder as a second recognition mark on the board at a prescribed position; and an electronic component mounting step of positioning the solder-printed board, referring to mounting information stored in advance as information indicating an execution mode of a mounting operation, and picking up an electronic component from a component supply unit by a mounting head, and transferring and placing the electronic component to and on the solder-printed board at a mounting position according to a mounting mode that is set for each of the electronic component mounting apparatuses in advance in the mounting information, wherein the execution mode includes one of two mounting modes including a first mounting mode and a second mounting mode, wherein in the first mounting mode, the electronic component is transferred to and placed at a mounting position that has been corrected on the basis of a recognition result of the first recognition mark, and wherein in the second mounting mode, the electronic component is transferred to and placed at a mounting position that has been corrected on the basis of a recognition result of the second recognition mark.

Advantages of the Invention

In the invention, one of the first mounting mode in which an electronic component is mounted on the basis of recognition results of the first recognition marks for board position detection without taking solder position deviations into consideration and the second mounting mode in which an electronic component is mounted on the basis of recognition results of the second recognition marks formed by printing solder for solder position deviation detection taking solder position deviations into consideration is set for each electronic component as an execution mounting mode. In component mounting work, each electronic component is mounted on a board according to a mounting mode that is set for each of the electronic component mounting apparatuses in advance. As a result, a mounting position can be corrected properly according to the characteristics of each electronic component without the need for performing any solder inspection for determining solder position detection, whereby an intended bonding quality enhancement effect can be obtained.

BRIEF DESCRIPTION OF THE DRAWINGS

FIG. 6 shows the structure of mounting information used in the electronic component mounting apparatus employed in the first embodiment of the invention.

FIGS. 7(*a*) and 7(*b*) show the structure of mounting mode information that is used in the electronic component mounting apparatus employed in the first embodiment of the invention.

MODE FOR CARRYING OUT THE INVENTION (Embodiment 1)

Figure 1:
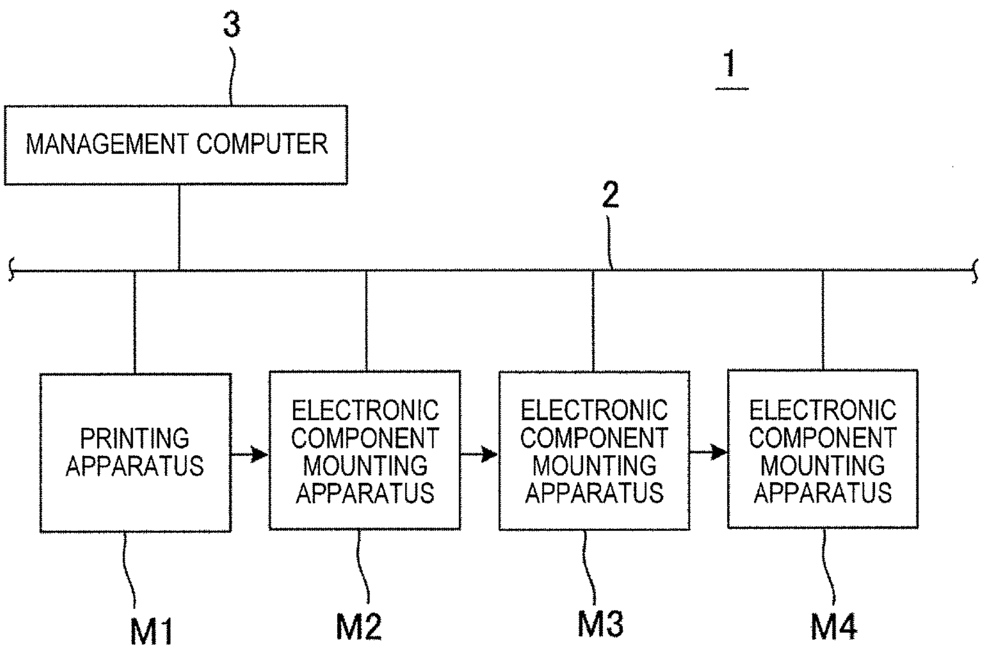
FIG. 1 is a block diagram showing the configuration of an electronic component mounting system according to a first embodiment of the present invention.

First, an electronic component mounting system according to a first embodiment will be described with reference to FIG. 1. As shown in FIG. 1, the electronic component mounting system 1 which has a function of manufacturing a mounted board by mounting an electronic component on a board is configured in such a manner that an electronic component mounting line that is formed by connecting a plurality of apparatuses for electronic component mounting, that is, a printing apparatus M1 and electronic component mounting apparatuses M2-M4 are connected to a management computer 3 by a communication network 2 and controlled as a whole by it.

The printing apparatus M1 screen-prints solder in paste form on electronic component bonding electrodes formed on a board. The electronic component mounting apparatuses M2-M4 pick up electronic components from a component supply unit by a mounting head and transfer and place them on a solder-printed board at their mounting positions. The board that has been mounted with the electronic components is supplied to a reflow process, where the electronic components mounted on the board are soldered to the board. A mounted board is thus manufactured.

Figure 2:
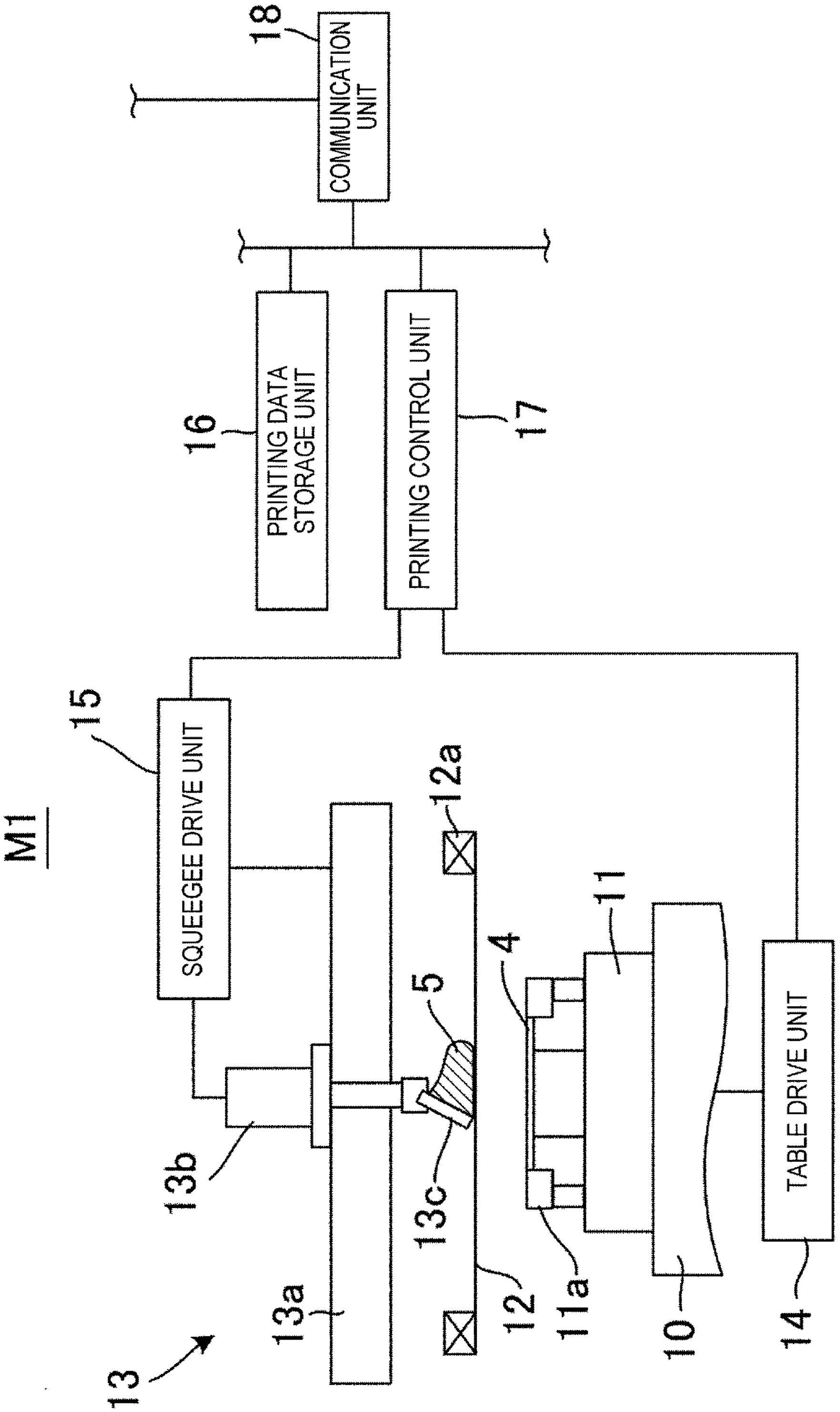
FIG. 2 is a block diagram showing the configuration of a printing apparatus employed in the first embodiment of the invention.

Next, the configuration of each apparatus will be described. First, the configuration and functions of the printing apparatus M1 will be described with reference to FIGS. 2 and 3(*a*)-3(*c*). As shown in FIG. 2, a board holding unit 11 is disposed on a positioning table 10. The board holding unit 11 holds a board 4 from both sides by putting it between clampers 11*a*. By driving the positioning table 10 by a table drive unit 14, the board 4 is moved relative to a mask plate 12 in the horizontal and vertical directions and positioned at a printing position.

Figure 3A:
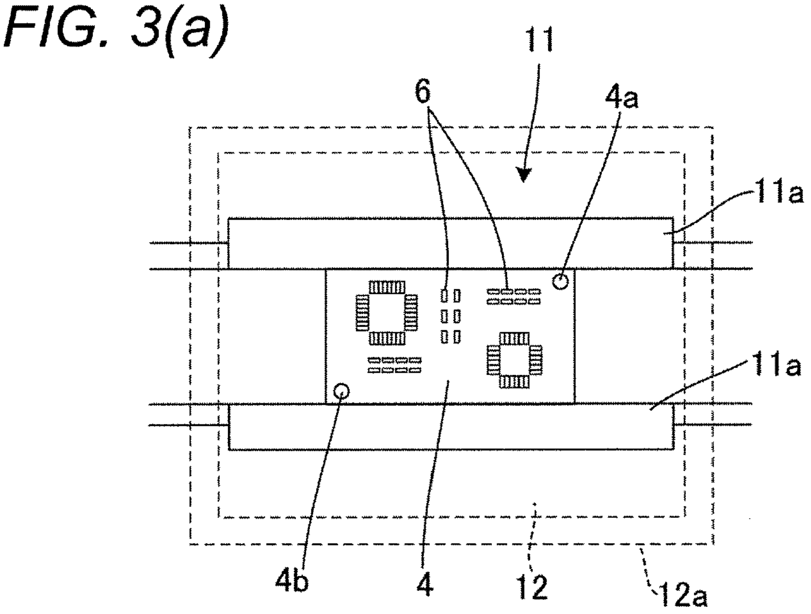
FIGS. 3(*a*)-3(*c*) illustrate a board and a mask plate that are used in the printing apparatus employed in the first embodiment of the invention.
Figure 3B:
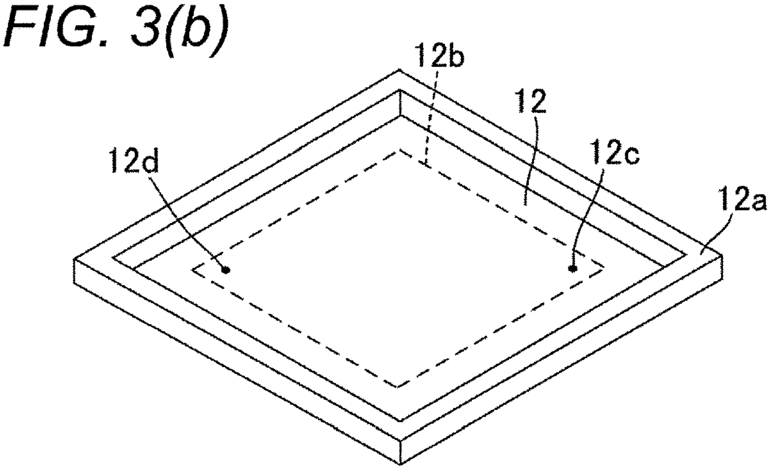
Figure 3C:
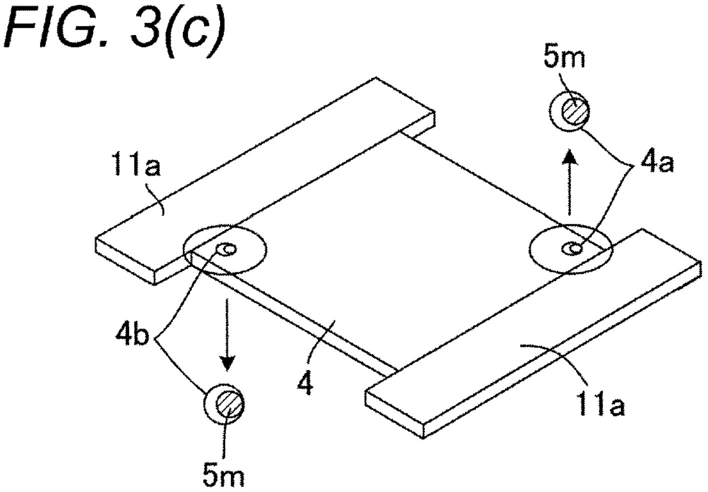

As shown in FIG. 3(*a*), the board 4 is formed with a plurality of electrodes 6 for bonding of a component and formed with a pair of first recognition marks 4*a* and 4*b* at diagonal positions. The mask plate 12 which is stretched in a mask frame 12*a* is disposed over the board holding unit 11. As shown in FIG. 3(*b*), in the mask plate 12, a mask pattern (not shown) corresponding to the shapes and arrangement of the electrodes 6 are formed in a printing range 12*b* corresponding to the board 4 and pattern holes 12*c* and 12*d* are formed at diagonal positions of the printing range 12*b* that correspond to the respective first recognition marks 4*a* and 4*b* of the board 4.

A squeegee unit 13 is disposed over the mask plate 12. The squeegee unit 13 is composed of an elevation/pressing mechanism 13*b* for elevating and lowering a squeegee 13*c* relative to the mask plate 12 and pressing the squeegee 13*c* against the mask plate 12 with a prescribed pressing force and a squeegee moving mechanism 13*a* for moving the squeegee 13*c* horizontally. The elevation/pressing mechanism 13*b* and the squeegee moving mechanism 13*a* are driven by a squeegee drive unit 15. When the squeegee 13*c* is moved horizontally at a prescribed speed across the surface of the mask plate 12 that is supplied with solder 5 in a state that the board 4 is pressed against the mask plate 12, solder 5 is printed on the top surface of the board 4 through pattern holes.

As a result of this printing operation, solder 5 for bonding of an electronic component is printed on the component bonding electrodes 6 which are formed on the top surface of the board 4 on which the first recognition marks are formed in advance. And, as shown in FIG. 3(*c*), solder marks 5*m* as second recognition marks are printed on the first recognition marks 4*a* and 4*b* through the pattern holes 12*c* and 12*d*, respectively. At this time, the positions of the solder 5 do not always coincide with those of the first recognition marks 4*a* and 4*b* correctly; positional deviations occur that correspond to a positioning error between the board 4 and the mask plate 12.

This printing operation is performed as a printing control unit 17 controls the table drive unit 14 and the squeegee drive unit 15. In this control, the operation of the squeegee 13*c* and the positioning between the board 4 and the mask plate 12 are controlled on the basis of printing data that is stored in a printing data storage unit 16. A communication unit 18 performs data exchange with the management computer 3 and the other apparatus of the electronic component mounting line over the communication network 2.

Figure 4:
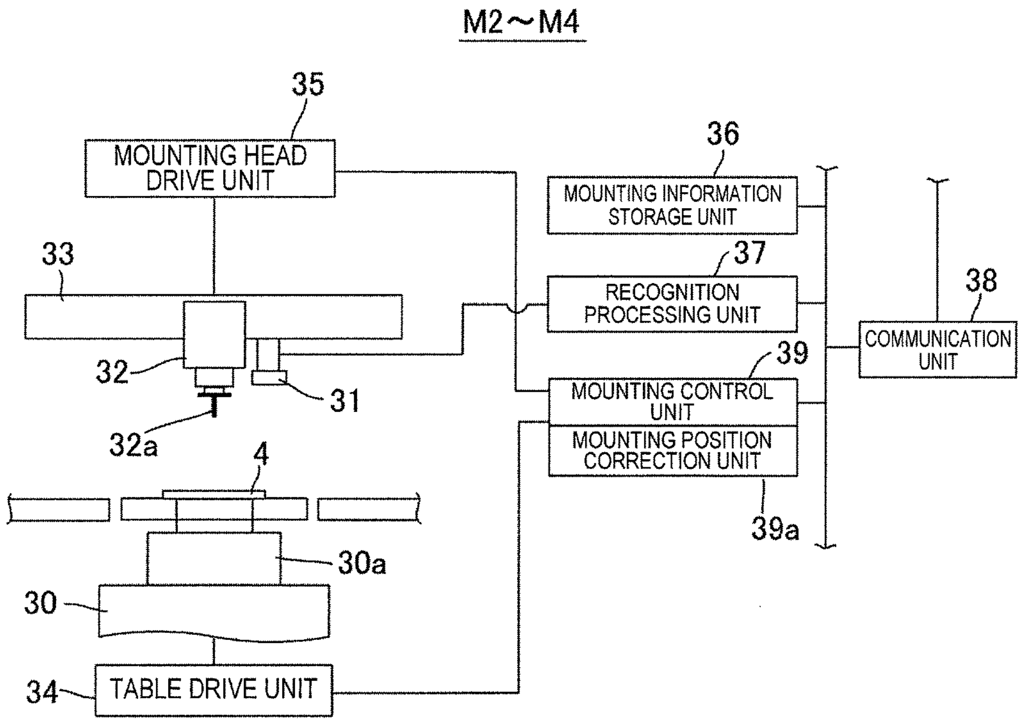
FIG. 4 is a block diagram showing the configuration of each of electronic component mounting apparatuses employed in the first embodiment of the invention.

Next, the configuration of each of the electronic component mounting apparatuses M2-M4 will be described with reference to FIG. 4. As shown in FIG. 4, a board holding unit 30*a* is disposed over a positioning table 30 and holds a board 4 that is conveyed from the printing apparatus M1 or the upstream electronic component mounting apparatus and is positioned. A mounting head 32 which is moved by a head drive mechanism 33 is disposed over the board holding unit 30*a*. Equipped with a nozzle 32*a* for absorbing an electronic component, the mounting head 32 picks up an electronic component from a component supply unit (not shown) by absorbing and holding it by means of the nozzle 32*a*. An electronic component 7 (described later) that is held by the nozzle 32*a* is transferred to and placed on the board 4 by moving the mounting head 32 to over the board 4 and lowering it toward the board 4.

A board recognition camera 31 which is moved together with the mounting head 32 is installed on the head drive mechanism 33 with its image surface directed downward, and shoots the board 4 as it is moved over the board 4. A shooting result is recognition-processed by a recognition processing unit 37, whereby positions of the first recognition marks 4*a* and 4*b* formed on the board 4, solder marks 5*m* as second recognition marks (see FIG. 3(*c*)), and mounting points are recognized.

The head drive mechanism 33 and the positioning table 30 are driven by a mounting head drive unit 35 and a table drive unit 34, respectively, which are controlled by a mounting control unit 39. The mounting control unit 39 is equipped with a mounting position correction unit 39*a* as an internal processing function. The mounting position correction unit 39*a* performs, prior to mounting of a component, processing of correcting mounting positions on the basis of results of the recognition, by the recognition processing unit 37, of the results of the shooting of the first recognition marks 4*a* and 4*b* and the solder marks 5*m* by the board recognition camera 31. The mounting control unit 39 performs the control processing by referring to mounting information 40 stored in a mounting information storage unit 36(see FIGS. 6 and FIGS. 7(*a*) and 7(*b*)). The mounting information 40 is information that prescribes modes of execution of a mounting operation to be performed by the electronic component mounting apparatus.

Figure 5A:
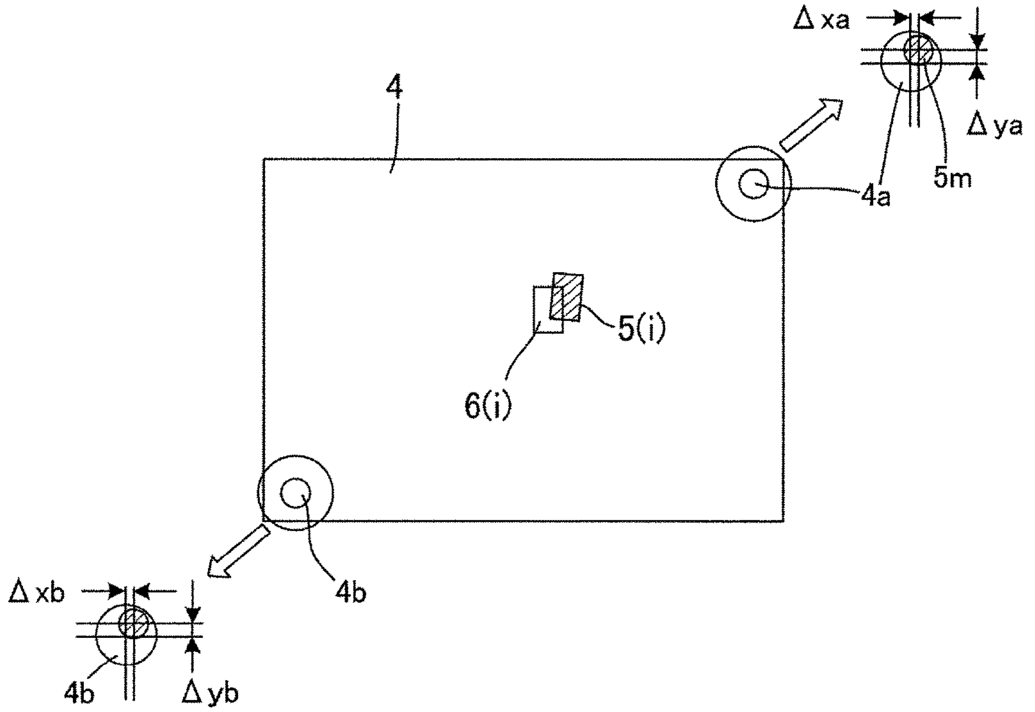
FIGS. 5(*a*)-5(*b*) illustrate how marks are recognized in each of the electronic component mounting apparatuses employed in the first embodiment of the invention.
Figure 5B:
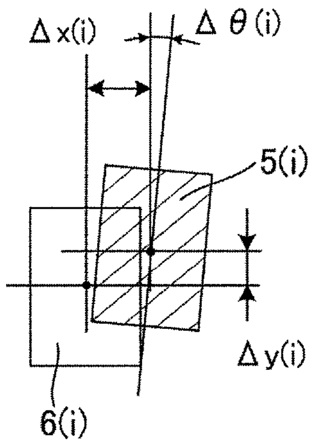

Next, a function of estimating calculation of solder positional deviation amounts that is performed by the recognition processing unit 37 will be described with reference to FIGS. 5(*a*) and 5(*b*). As shown in FIG. 5(*a*), shooting results of the first recognition marks 4*a* and 4*b* and solder marks 5*m* that have been printed so as to correspond to them are recognition-processed by the recognition processing unit 37, whereby a positional deviation amount between two diagonal points (points A and B) on a board 4 (i.e., a board positional deviation amount indicating a positional deviation state of the board 4) and printing position deviation amounts ($\Delta xa$ , $\Delta ya$ ) and ($\Delta xb$ , $\Delta yb$) at the two respective points (points A and B) are calculated. Based on the printing position deviation amounts at these two points, a positional deviation state of solder 5(i) that has been printed for any electrode 6(i) on the board 4 can be determined by estimating calculation.

That is, if expansion or contraction of the mask plate 12 is disregarded, printing position deviation amounts at each point, on the top surface of the board 4, of printing that is performed at one time by a single squeegeeing operation can be regarded as being determined uniquely by a relative positional deviation state between the board 4 and the mask plate 12. More specifically, conversion equations between the orthogonal coordinate systems of the board 4 and those of the mask plate 12 can be derived on the basis of the printing position deviation amounts at the above two points. As shown in FIG. 5(*b*), estimated positional deviation amounts ($\Delta x(i)$, $\Delta y(i)$, $\Delta\theta(i)$) in the X, Y, and Θ directions of solder 5(i) printed for an electrode 6(i) at any position can be calculated by this coordinate conversion.

In the embodiment, switching is made according to the characteristics of a subject electronic component between a first mounting mode in which mounting is performed using, as references, positions of electrodes 6 of design data as corrected only on the basis of recognition results of the first recognition marks 4*a* and 4*b* without correcting a mounting position taking printing position deviations into consideration and a second mounting mode in which estimated positional deviation amounts of solder 5 at each electrode 6 are calculated on the basis of printing position deviation amounts ($\Delta xa$, $\Delta ya$) and ($\Delta xb$, $\Delta yb$) of solder marks 5*m* which are second recognition marks and a mounting position is corrected on the basis of the estimated positional deviation amounts.

In the above configuration, the mounting position correction unit 39*a* serves as a mounting position correcting means which corrects a mounting position on the basis of recognition results of recognition marks (first recognition marks 4*a* and 4*b* and solder marks 5*m*). The mounting position correcting means corrects a mounting position on the basis of recognition results of one of two sets of recognition marks, that is, the first recognition marks 4*a* and 4*b* and solder marks 5*m* as second recognition marks.

Next, the mounting information 40 which is stored in the mounting information storage unit 36 will be described with reference to FIG. 6 and FIGS. 7(*a*) and 7(*b*). First, mounting information 40(1) will be described with reference to FIG.

6. The mounting information 40(1) indicates kinds of electronic components as subjects of mounting by the electronic component mounting apparatuses M2-M4 and their sets of mounting coordinates on a board 4. In this example, for each of the electronic component mounting apparatuses M2-M4, component information 40*b* ("A," "B," "C," . . . ) indicating component codes or the like of subject components and mounting coordinates 40*c* ((X1, Y1, θ1), . . . ) indicating sets of coordinates X, Y, and θ) of mounting points of those respective components are prescribed so as to correspond to respective mounting Nos. 40*a* for identification of respective mounting operations to be performed on the board. A mounting sequence for the work subject board is determined by reading the mounting information 40(1).

Next, mounting information 40(2) and mounting information 40(3) will be described with reference to FIGS. 7(*a*) and 7(*b*). The mounting information 40(2) shown in FIG. 7(*a*) is mounting mode information in which mounting modes that specify mounting position correction modes of the mounting subject board to be processed by the electronic component mounting apparatuses M2-M4 are set for the respective electronic components. More specifically, component information 40*b*, a size 40*d* (e.g., (XA, YA, ZA)) indicating dimensions in the X, Y, and Z directions of each subject component, and a mounting mode 40*e* indicating whether the execution mounting mode to be employed for the component is the second mode or the first mode in the form of a flag "2" or "1" are set for a mounting No. 40*a* for identification of a mounting operation to be performed on the board.

Figure 8A:
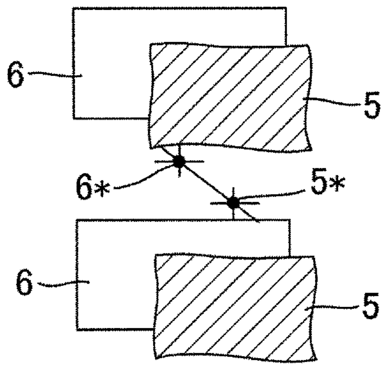
FIGS. 8(*a*)-8(*c*) illustrate a first mounting mode that is used in the electronic component mounting apparatus employed in the first embodiment of the invention.
Figure 8B:
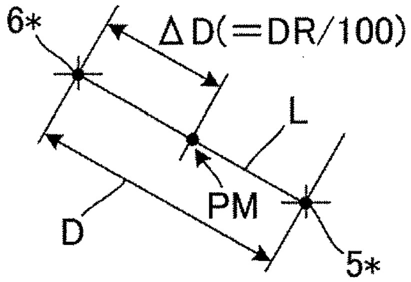
Figure 8C:
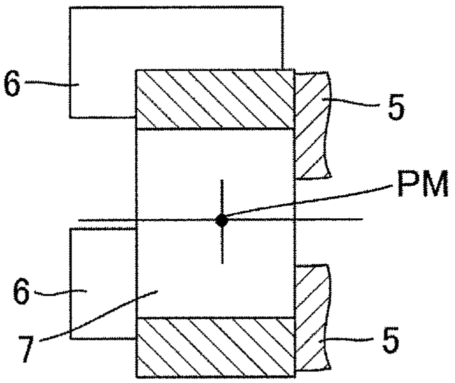

The second mounting mode is a mode in which an electronic component is transferred to and placed at a mounting position that has been corrected on the basis of recognition results of solder marks 5*m* which are second recognition marks. In this mode, a mounting position is corrected by the mounting position correction unit 39*a* on the basis of position deviation amounts estimation-calculated by the recognition processing unit 37. When as shown in FIG. 8(*a*) a positional deviation exists between a position on design data indicated by mounting coordinates 40*c* of the mounting information 40(1), that is, a center-of-gravity position 6* of a pair of electrodes, and a center-of-gravity position 5* of printed solder 5, a mounting position PM where an electronic component 7 (see FIG. 8(*c*)) should be placed actually is determined by a correction method shown in FIG. 8(*b*).

In this example, a corrected mounting position PM is set on a positional deviation line L that connects the center-of-gravity positions 6* and 5*. That is, a point that is distant from the center-of-gravity position 6* by a correction amount ΔD on the positional deviation line L is made a mounting position PM. The correction amount ΔD is calculated by multiplying the entire positional deviation amount D by a preset follow ratio R (%) (see FIG. 7(*b*)). The follow ratio R is set at a proper value in advance for each kind of electronic component on the basis of empirical values and trial results. In the illustrated example, the follow ratio R is 50% and hence a mounting position PM is set at the center of the positional deviation line L. In a component mounting operation on the electrodes 6, as shown in FIG. 8(*c*) the mounting head 32 is position-controlled using the thus-calculated mounting position PM as a target.

By setting mounting positions PM by the above-described correction method, even in a case that printing positions of solder 5 do not coincide with the positions of electrodes 6 (i.e., a positional deviation exists), the rate of occurrence of a mounting failure can be kept low by reducing the influences of the printing position deviation utilizing the self-alignment effect that electrodes 6 attract an electronic component 7 together with molten solder due to the surface tension of the molten solder that acts on the electronic component 7 in a reflow process that is executed after placement of the components. The self-alignment effect is particularly effective for small components such as minute chip components that tend to be moved by the surface tension of molten solder. Therefore, in the embodiment, the second mounting mode is applied if a subject electronic component 7 is a small component.

Figure 9A:
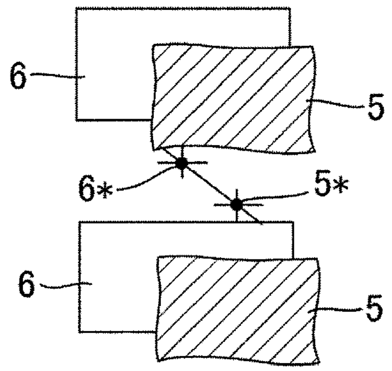
FIGS. 9(*a*)-9(*c*) illustrate a second mounting mode that is used in the electronic component mounting apparatus employed in the first embodiment of the invention.
Figure 9B:
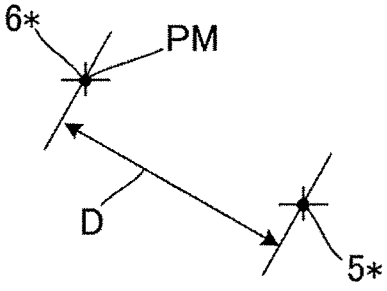
Figure 9C:
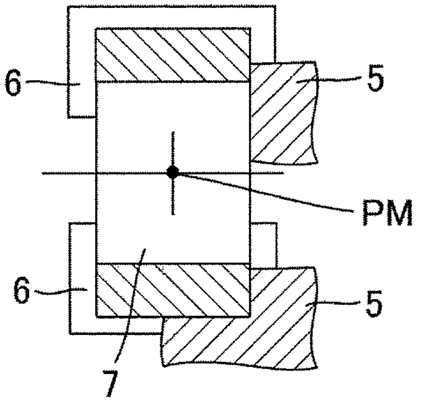

In contrast, the first mounting mode is a mode in which an electronic component is transferred to and placed at a mounting position that is determined by using, as references, positions of electrodes 6 as corrected only on the basis of recognition results of the first recognition marks 4*a* and 4*b* without taking solder position deviation amounts into consideration. More specifically, even in a case that as shown in FIG. 9(*a*) a positional deviation exists between a center-of-gravity position 6* of a pair of electrodes and a center-of-gravity position 5* of printed solder 5 and as shown in FIG. 9(*b*) the center-of-gravity positions 6* and 5* are distant from each other by a positional deviation amount D, the center-of-gravity position 6* is set as a mounting position PM by using only the positions of the electrodes 6 as references. As shown in FIG. 9(*c*), the mounting head 32 is position-controlled using the thus-set mounting position PM as a target. In the embodiment, the first mounting mode is applied to large electronic components such as connector components for which the above-described self-alignment effect could not be exploited effectively.

Next, the mounting information 40(3) shown in FIG. 7(*b*) will be described with reference to FIGS. 10(*a*) and 10(*b*). The mounting information 40(3) is mode application selection information to be used for selecting a manner of application of a mounting mode, that is, data that prescribes, in advance, for a case that the second mounting mode is applied, an application range of the second mounting mode and follow ratios R and limit values for directions in the application range. More specifically, a mounting mode 40*a* (which is the same as in the mounting information 40(1)), mounting mode effectiveness 40*f*, follow ratios 40*g*, and limit values 40*h* are set for each mounting No. 40*a* for identification of a mounting operation to be performed on a board concerned.

Figure 10A:
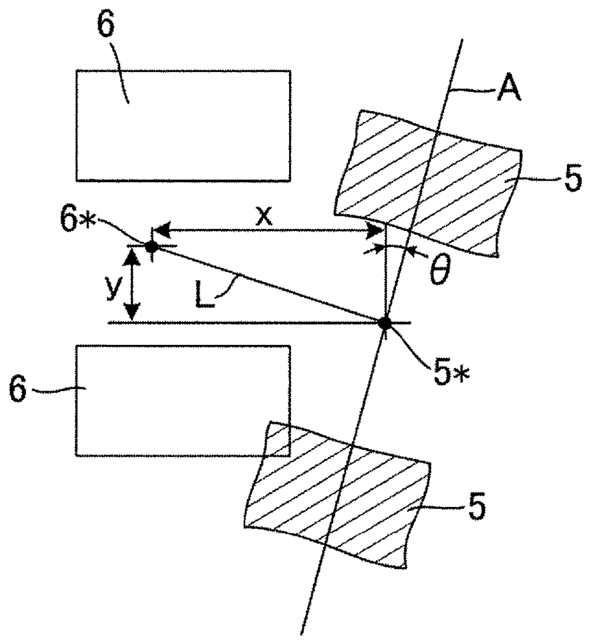
FIGS. 10(*a*) and 10(*b*) illustrate first mode application selection information that is used in the electronic component mounting apparatus employed in the first embodiment of the invention.
Figure 10B:
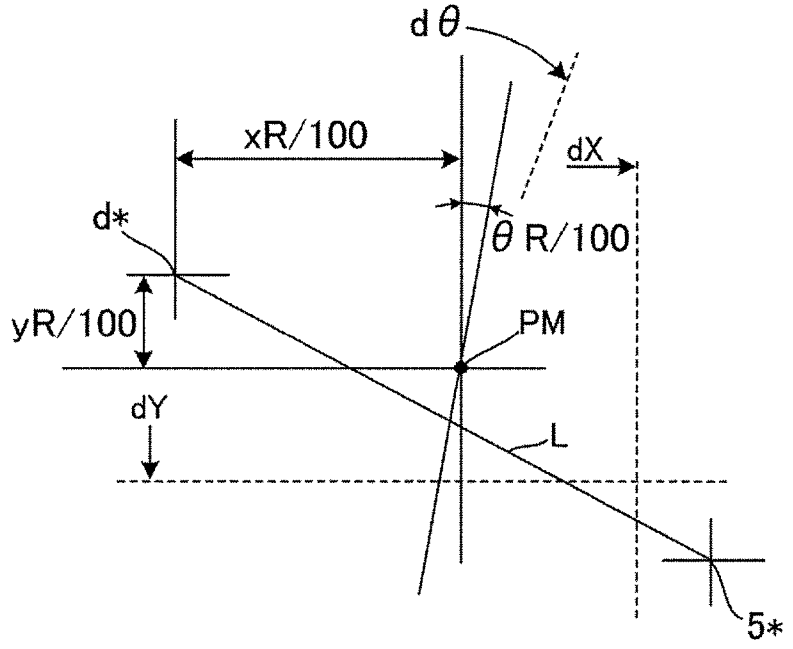

As shown in FIG. 10(*a*), a solder position deviation state of solder 5 corresponding to a pair of electrodes 6 is represented by components x and y in the two horizontal directions of a positional deviation line L that indicate an amount and a direction of a positional deviation and a deviation angle θ of a direction line A of the pair of printed solder 5 with respect to a reference direction (i.e., an arrangement direction of the electrodes 6). To facilitate the illustration, the positional deviation state is exaggerated in this drawing; in actuality the invention is not directed to such a large positional deviation.

In a mounting position correction for such a solder position deviation state, the mounting mode effectiveness 40*f* indicates whether to apply the correction method that is based on solder position deviation amounts for each of the three directions, that is, the X, Y, and θ directions, of a solder position deviation amount. More specifically, in the mounting mode effectiveness 40*f*, this correction method is applied to only directions that are given mark "o" among the three directions X, Y, and θ. The follow ratio R 40*g* indicates a follow ratio R (%) to be used for calculating correction amount in each of the directions that are mark "o" in the mounting mode effectiveness 40*f*. More specifically, as shown in FIG. 10(*b*), in calculating a corrected mounting position PM, correction amounts in the respective directions are calculated by multiplying the position deviation components x, y, and θ shown in FIG. 10(*a*) by the follow rates R (%) that are set in the respective directions.

That is, the mounting information 40 includes the follow rates (%) each of which indicates a ratio of a correction amount to a position deviation amount for solder 5 calculated by a position deviation amount calculation unit 43*a*. Each of the electronic component mounting apparatuses M2-M4 mounts an electronic component 7 at a mounting position PM as corrected according to a preset follow ratio R (%). As for the follow ratios R 40*g* that are contained in the mounting information 40(3), ratios can be set for components in the X direction, the Y direction, and the θ direction, respectively.

Furthermore, the limit values 40*h* are information indicating limit values to be used for determining correction amounts in respective directions in which position correction should be made. In a mounting position correction, for certain kinds of components, the bonding quality may be impaired by setting too large correction amounts. Therefore, for electronic components having such a characteristic, upper limit allowable correction amounts are set as limit values in advance.

That is, in the embodiment, the mounting information 40 which prescribes execution modes of mounting operations to be performed by the electronic component mounting apparatuses M2-M4 and is stored in the mounting information storage unit 36 includes limit values that indicate upper limit correction amounts that are allowable in a mounting position correction. If a correction amount calculated by the mounting position correction unit 39*a* is larger than a limit value that is set in the limit values 40*h*, an electronic component 7 is mounted at a mounting position PM as corrected using the limit value as a correction amount.

By setting mounting mode effectiveness 40*f*, follow ratios R 40*g*, and limit values 40*h* for each electronic component in the above-described manner, a mounting position correction that uses a solder printing position as a reference can be performed more precisely according to characteristics of the electronic component. In view of the fact that the manner of occurrence of a mounting failure and the distribution of frequencies of occurrence of mounting failures vary in a variety of manners depending on the shape of electrodes 6, the size and shape of each electronic component 7, the viscosity of solder 5, and other factors, data indicating relationships between the mounting position PM and the degree of occurrence of a mounting failure are obtained by experiments by carrying out mounting trials while shifting the mounting position PM little by little. By storing resulting data as the mounting information 40 and applying those data according to a subject electronic component 7, high soldering quality can be secured even in a case of highly difficult mounting such as a case that a minute component is mounted on a fine-pitch circuit board.

Figure 11:
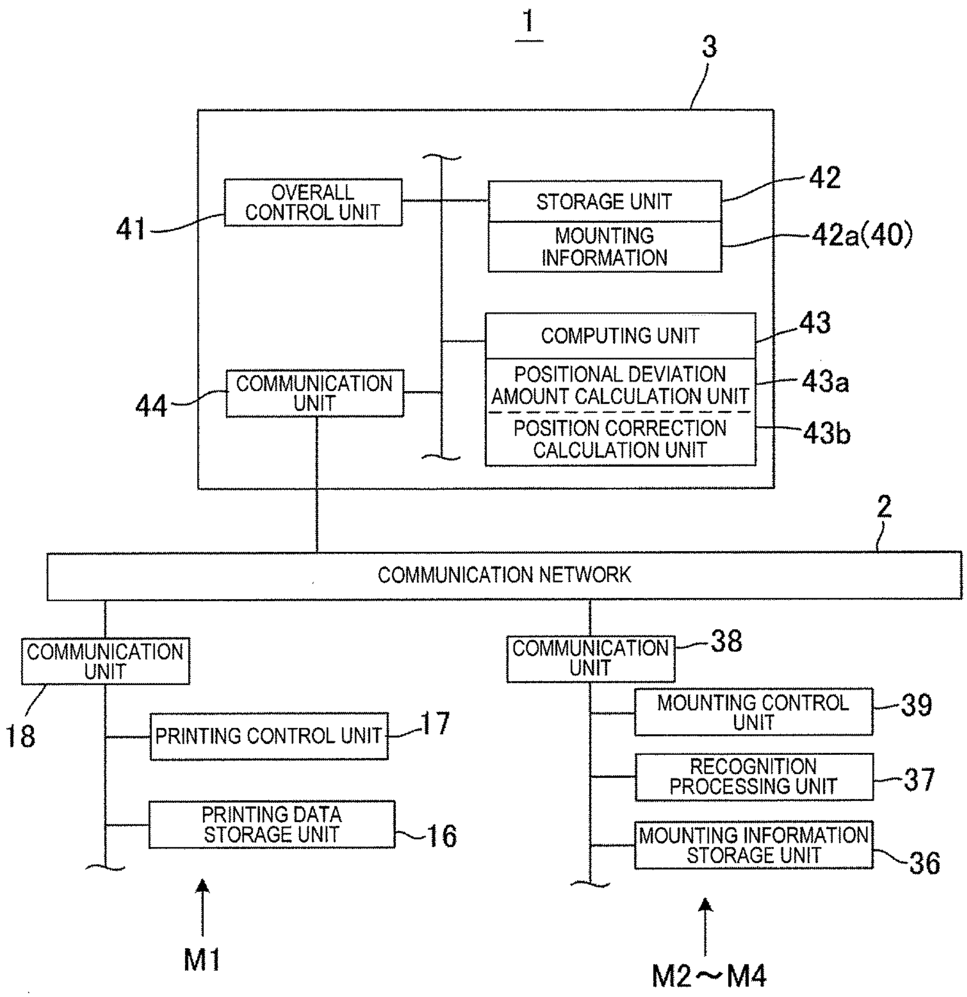
FIG. 11 is a block diagram showing the configuration of a control system of the electronic component mounting system according to the first embodiment of the invention.

Next, the configuration of a control system of the electronic component mounting system 1 is described with reference to FIG. 11. As shown in FIG. 11, the management computer 3 is equipped with an overall control unit 41, a storage unit 42, and a computing unit 43 and is connected to the communication unit 2 through a communication unit 44. The overall control unit 41 has a function of supervising controls of the individual apparatus constituting the electronic component mounting system 1. The storage unit 42 stores production management data to be used for managing work that is performed by the electronic component mounting system 1 and mounting information 42*a*. The mounting information 42*a* is data that is similar to the mounting information 40 which is stored in the mounting information storage unit 36 of each of the electronic component mounting apparatuses M2-M4.

The computing unit 43 performs various kinds of computation to perform component mounting work. The various kinds of computation include ones relating to the functions of a positional deviation amounts calculation unit 43*a* and a position correction calculation unit 43*b*. The positional deviation amounts calculation unit 43*a* estimation-calculates solder position deviation amounts shown in FIG. 5(*b*). The position correction calculation unit 43*b* performs calculations for correcting mounting positions on the basis of the estimation-calculated solder position deviation amounts by referring to the mounting information 42*a*. Although in the embodiment calculations for correcting mounting positions are performed by the mounting position correction units 39*a* of the electronic component mounting apparatuses M2-M4, they may be performed by the above computing functions of the management computer 3.

The printing data storage unit 16 and the printing control unit 17 of the printing apparatus M1 are connected to the communication network 2 through the communication unit 18. The mounting information storage unit 36, the recognition processing unit 37, and the mounting control unit 39 of each of the electronic component mounting apparatuses M2-M4 are connected to the communication network 2 through the communication unit 38. As a result, the mounting information 42*a* stored in the storage unit 42 is transmitted to the individual mounting apparatus and stored in the mounting information storage units 36 as the mounting information 40.

Figure 12:
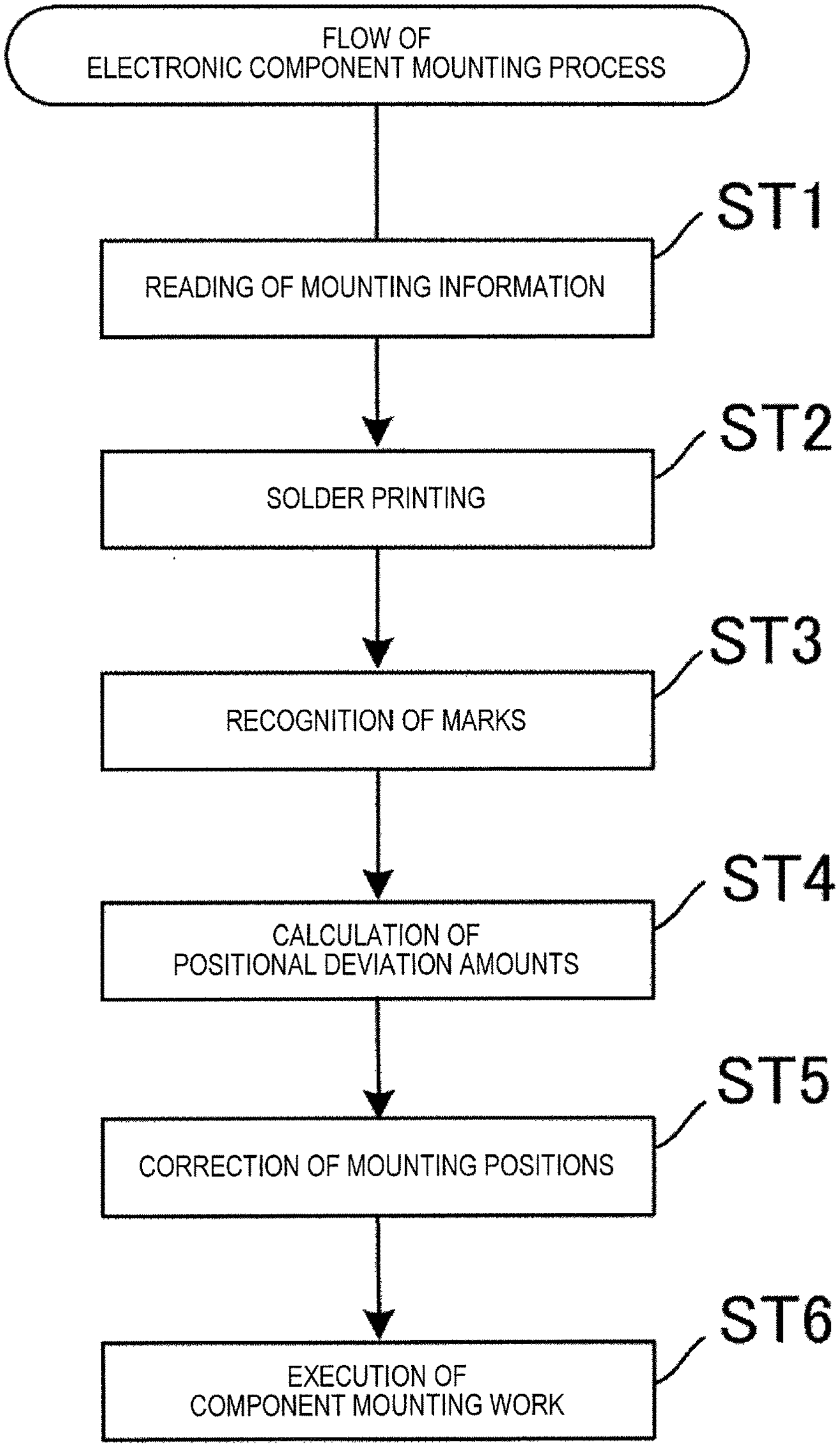
FIG. 12 is a flowchart of an electronic component mounting process of the electronic component mounting system according to the first embodiment of the invention.

The electronic component mounting system is configured as described above. An electronic component mounting method by which the electronic component mounting system 1 manufactures a mounted board by mounting electronic component on a board will be described with reference to a flowchart of FIG. 12 and other drawings. First, prior to a start of manufacture, mounting information is read (ST1). More specifically, the electronic component mounting apparatuses M2-M4 read the mounting information 40 stored in the mounting information storage unit 36 and thereby take in information that is necessary for component mounting work.

Solder printing is then performed on a board that is carried in to the printing apparatus M1 from the upstream side (ST2). More specifically, solder 5 is printed on component bonding electrodes 6 of a board 4 on which first recognition marks 4*a* and 4*b* are formed in advance and solder marks 5*m* are printed as second recognition marks on the board 4 at prescribed position (printing step). Then the solder-printed board 4 is carried in to the electronic component mounting apparatus M2 and mark recognition is performed (ST3). More specifically, as shown in FIG. 5(*a*), the first recognition marks 4*a* and 4*b* and the solder marks 5*m* are shot by the board recognition camera 31 and shooting results are subjected to recognition processing by the recognition processing unit 37. As a result, as shown in FIG. 5(*b*), positional deviation amounts between positions of each electrode 6(*i*) and a printed solder 5(*i*) are calculated (positional deviation calculating step) (ST4).

Subsequently, electronic components 7 are picked up from the component supply unit by the mounting head 32 and transferred to and placed at mounting positions on the board 4 on which the solder 5 is printed according to preset mounting modes, respectively (electronic component mounting step). In the electronic component mounting step, first, mounting position correction processing is performed in which mounting positions are corrected on the basis of the calculated positional deviation amounts (ST5) and component mounting work is done (ST6). Thus, the electronic components 7 are mounted at the corrected mounting positions PM as shown in FIGS. 7(*a*) and 7(*b*) or FIGS. 8(*a*) and 8(*b*).

In the electronic component mounting step, each electronic component mounting apparatus, the electronic components 7 are mounted on the board 4 according to the execution mounting modes that are preset for the respective electronic components by referring to the mounting information 40(2) shown in FIG. 6(*a*). In the embodiment, one of the second mounting mode in which an electronic component 7 is transferred to and placed at a mounting position PM that has been estimation-calculated on the basis of recognition results of the solder marks 5*m* which are second recognition marks and the first mounting mode in which an electronic component 7 is transferred to and placed at a mounting position PM that is determined by using, as references, positions of electrodes 6 as corrected only on the basis of recognition results of the first recognition marks 4*a* and 4*b* without taking position deviation amounts into consideration is set in advance for each electronic component as an execution mounting mode.

Where the second mounting mode is set as an execution mounting mode, whether to employ the second mounting mode for each of positional deviation amounts (components) in the X, Y, and Θ directions by reading the corresponding mounting mode effectiveness 40*f*, follow ratios R 40*g*, and limit values 40*h* by referring to the mounting information 40(3) shown in FIG. 7(*b*). Furthermore, the electronic component 7 is mounted at a mounting position PM that has been obtained by correcting the positional deviation amount in each of the directions to which the second mounting mode should be applied, according to the follow ratio R (%) that is set as the follow ratio R 40*g*. If a correction amount that is based on the calculated positional deviation amount is larger than the limit value that is set as the limit value 40*h*, the electronic component 7 is mounted at a mounting position PM as corrected using the limit value as a correction amount.

The board 4 on which the electronic components 7 have been mounted in the above-described manner is supplied to a downstream reflow process, where the board 4 is heated according to a prescribed temperature profile. The solder component in the solder 5 is melted and the electronic components 7 are thereby soldered to the electrodes 6. In the electronic component mounting process, since as described above the mounting position correction using a solder printing position as a reference is employed properly according to the characteristics of each electronic component, the self-alignment effect which reduces a solder position deviation in soldering can play its role effectively. The intended bonding quality enhancement effect can be obtained by a simple method without requiring any print inspection process for determining solder position deviation amounts.

(Embodiment 2)

Figures 13A, 13B:
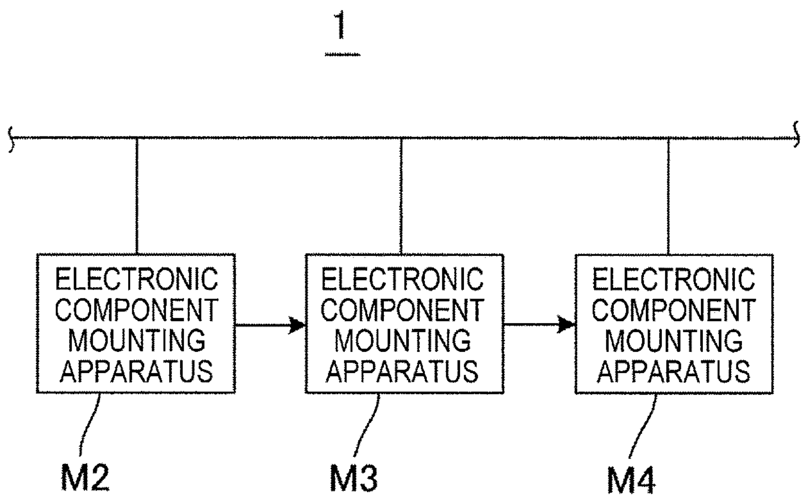
FIGS. 13(*a*) and 13(*b*) show the configuration of an electronic component mounting system according to a second embodiment of the invention and mounting mode information used therein.

Whereas in the first embodiment mounting modes are set in advance for respective electronic components in the mounting information 40, in a second embodiment mounting modes are set in a fixed manner for the respective electronic components mounting apparatuses constituting an electronic component mounting system 1. In the electronic component mounting system 1 shown in FIG. 13(*a*) which is the same in apparatus arrangement as that according to the first embodiment, a plurality of electronic component mounting apparatuses M2-M4 are arranged in this order from the upstream side. Each of the electronic component mounting apparatuses M2-M4 has the same configuration as in the first embodiment (see FIG. 4). The mounting information storage unit 36 of each electronic component mounting apparatuses stores mounting information 40(4) shown in FIG. 13(*b*) in place of the mounting information 40(2) shown in FIG. 7(*a*).

In the mounting information 40(4), the first mounting mode indicated by a flag "1" of an application mounting mode 40*j* or the second mounting mode indicated by a flag "2" is correlated with each electronic component mounting apparatus that is identified by an apparatus No. 40*i*. In this embodiment, the second mounting mode is correlated with the electronic component mounting apparatuses M2 and M3 and the first mounting mode is correlated with the electronic component mounting apparatus M4. In component mounting work of each of the electronic component mounting apparatuses M2-M4, electronic components are mounted on a board according to the execution mounting mode corresponding to the electronic component mounting apparatuses by referring to the mounting information 40(4).

As described above, the second mounting mode in which a mounting position is corrected in an electronic component mounting process using an estimation-calculated solder printing position as a reference is mainly applied to small components such as minute chip components that tend to be moved by the surface tension of molten solder. In the apparatus arrangement of electronic component mounting systems in general, there is a strong tendency that an electronic component mounting apparatus for mounting small components such as chip components is disposed on the upstream side and an electronic component mounting apparatus for mounting large components such as connector components is disposed on the downstream side.

In other words, an electronic component mounting apparatus for mounting small components to which the second mounting mode should be applied is disposed on the upstream side in an electronic component mounting system and an electronic component mounting apparatus for mounting large components to which the first mounting mode should be applied in which no mounting position correction using solder printing positions as references is performed is disposed on the downstream side in an electronic component mounting line. Therefore, where electronic components to be processed by an electronic component mounting system including a plurality of electronic component mounting apparatuses are classified broadly into two groups, that is, small components and large components, and the second mounting mode and the first mounting mode are set for the electronic component mounting apparatus for mounting the small components and the electronic component mounting apparatus for mounting the large components, respectively, in a fixed manner as execution mounting modes, almost the same advantage as provided by the first embodiment can be obtained without the need for changing the mounting mode from one electronic component to another in each electronic component mounting apparatus.

Although the invention has been described in detail by referring to the particular embodiments, it is apparent to those skilled in the art that various changes and modifications are possible without departing from the spirit and scope of the invention.

The present application is based on Japanese Patent Application No. 2012-280663 filed on Dec. 25, 2012, the disclosure of which is incorporated herein by reference.

INDUSTRIAL APPLICABILITY

Providing the advantage that an intended bonding quality enhancement effect can be obtained by a simple method without requiring a printing inspection process by properly applying a mounting position correction using solder printing positions as references, the electronic component mounting system and the electronic component mounting method according to the invention are useful when applied to a field that an electronic component is mounted on a board by soldering by means of a plurality of electronic components mounting apparatuses.

DESCRIPTION OF REFERENCE SIGNS

1: Electronic Component Mounting System
2: Communication Network
3: Management Computer
4: Board
4*a*, 4*b*: First Recognition Mark
5: Solder
5*m*: Solder Mark (Second Recognition Mark)
6: Electrode
7: Electronic Component
32: Mounting Head
M1: Printing Apparatus
M2-M4: Electronic Component Mounting Apparatus
PM: Mounting Position

The invention claimed is:

1. An electronic component mounting system which is formed by connecting a plurality of electronic component mounting apparatuses and which manufactures a mounted board by mounting electronic components on a board, said electronic component mounting system comprising:

a printing apparatus which prints solder on a component bonding electrode formed on the board on which a first recognition mark is formed in advance and which prints solder as a second recognition mark on the board at a prescribed position;

the plurality of electronic component mounting apparatuses, each of which positions the solder-printed board, picks up an electronic component from a components supplier by a mounting head, and transfers and places the electronic component to and on the solder-printed board; and a mounting information storage which stores execution mode information indicating in advance whether a first mounting mode or a second mounting mode is used for each of the electronic components, wherein in the first mounting mode, the electronic component is transferred to and placed at a mounting position on the basis of a recognition result of only the first recognition mark, and wherein in the second mounting mode, the electronic component is transferred to and placed at a mounting position that has been corrected on the basis of recognition results of the first and the second recognition marks; and wherein each of the electronic component mounting apparatuses mounts electronic components on the board according to mounting modes that are set for each of the respective electronic component mounting apparatuses in advance by referring to the execution mode information.

2. The electronic component mounting system according to claim 1, wherein:

each of the electronic component mounting apparatuses comprises a mounting position corrector which receives the execution mode information from the mounting information storage, and the mounting position corrector corrects the mounting position on the basis of the recognition results of the first and the second recognition marks if the second mounting mode is set for the respective electronic component mounting apparatus in the execution mode information.

3. The electronic component mounting system according to claim 2, wherein each electronic component mounting apparatus mounts electronic component on the basis of positions of electrodes formed on the board in the first mounting mode.

4. The electronic component mounting system according to claim 2, wherein the mounting position corrector calculates printing position deviations on the basis of the recognition results of the first recognition mark and the second recognition mark, and the mounting position corrector corrects the mounting position on the basis of the printing position deviations in the second mounting mode.

5. The electronic component mounting system according to claim 1, wherein:

the execution mode information is in a form of a flag indicating whether the first mounting mode or the second mounting mode is used for each of the electronic components, said flag being set in advance for each of the electronic components.

6. An electronic component mounting method for manufacturing a mounted board by mounting electronic components on a board by an electronic component mounting system formed by connecting a plurality of electronic component mounting apparatuses, said electronic component mounting method comprising:

printing solder on a component bonding electrode formed on the board on which a first recognition mark is formed in advance, and printing solder as a second recognition mark on the board at a prescribed position;

storing mounting information including execution mode information indicating in advance whether a first mounting mode and or a second mounting mode is used for each of the electronic components; and positioning the solder-printed board, referring to the mounting information, picking up an electronic component from a component supplier by a mounting head, and transferring and placing the electronic component to and on the solder-printed board at a mounting position according to the execution mode that is stored in advance and used for each of the electronic component mounting apparatuses in the mounting information, wherein in the first mounting mode, the electronic component is transferred to and placed at a mounting position on the basis only of a recognition result of the first recognition mark, and wherein in the second mounting mode, the electronic component is transferred to and placed at a mounting position that has been corrected on the basis of recognition results of the first and second recognition marks.

7. The electronic component mounting method according to claim 6, further comprising:

correcting the mounting position on the basis of the recognition results of the first and the second recognition marks if the second mounting mode is set for the respective electronic component mounting apparatus in the mounting information.

8. The electronic component mounting method according to claim 7, wherein each electronic component mounting apparatus mounts electronic component on the basis of positions of electrodes formed on the board in the first mounting mode.

9. The electronic component mounting method according to claim 7, further comprising:

calculating printing position deviations on the basis of the recognition results of the first recognition mark and the second recognition mark, wherein the mounting position is corrected on the basis of the printing position deviations in the second mounting mode.

* * * * *